(12) United States Patent
Fogal et al.

(10) Patent No.: US 6,321,970 B1
(45) Date of Patent: Nov. 27, 2001

(54) WIRE BONDING MACHINE

(75) Inventors: Rich Fogal; Michael B. Ball, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/695,368

(22) Filed: Oct. 23, 2000

Related U.S. Application Data

(63) Continuation of application No. 09/208,279, filed on Dec. 8, 1998, now Pat. No. 6,196,445, which is a continuation of application No. 08/905,183, filed on Aug. 4, 1997, now Pat. No. 6,015,079, which is a division of application No. 08/574,156, filed on Dec. 18, 1995, now Pat. No. 5,813,590.

(51) Int. Cl.$^7$ ............................. B23K 31/02; B23K 37/02
(52) U.S. Cl. ......................... 228/4.5; 228/45; 228/180.5
(58) Field of Search ................... 228/180.5, 4.5, 228/1.1, 110.1, 9, 102, 4.1, 44.7, 49.5, 45; 29/740, 741

(56) References Cited

U.S. PATENT DOCUMENTS

| | | | | |
|---|---|---|---|---|
| 3,603,357 | * | 9/1971 | Drummond | 140/147 |
| 3,641,660 | * | 2/1972 | Adams et al. | 29/471.1 |
| 3,646,307 | * | 2/1972 | Hazel | 219/80 |
| 3,737,983 | * | 6/1973 | King et al. | 29/574 |
| 3,776,447 | * | 12/1973 | Adams et al. | 228/3 |
| 3,799,535 | * | 3/1974 | Baumann | 269/309 |
| 3,894,671 | * | 7/1975 | Kulicke, Jr. et al. | 228/4.5 |
| 3,941,985 | * | 3/1976 | Kawase et al. | 235/151.1 |
| 3,960,309 | * | 6/1976 | Hazel | 228/4.5 |
| 4,116,376 | * | 9/1978 | Delorme et al. | 228/105 |
| 4,155,650 | * | 5/1979 | Yasue et al. | 356/400 |
| 4,266,710 | * | 5/1981 | Bilane et al. | 228/4.5 |
| 4,295,596 | * | 10/1981 | Doten et al. | 228/6.2 |
| 4,444,349 | * | 4/1984 | Bilane et al. | 228/102 |
| 4,498,638 | * | 2/1985 | Kurtz et al. | |
| 4,516,673 | * | 5/1985 | Kashihara et al. | 198/341 |
| 4,523,100 | * | 6/1985 | Payne | 250/559.33 |
| 4,659,004 | * | 4/1987 | Fridman | 228/6.2 |
| 4,768,698 | * | 9/1988 | Brown et al. | 228/49.5 |
| 4,820,013 | * | 4/1989 | Fuse | 350/96.27 |
| 4,838,472 | * | 6/1989 | Scavino | 228/4.5 |
| 4,877,173 | * | 10/1989 | Fujumoto et al. | 228/1.1 |
| 4,878,609 | * | 11/1989 | Farassat | 228/4.5 |
| 4,912,843 | * | 4/1990 | Dederer | 228/119 |
| 5,014,074 | * | 5/1991 | Dody et al. | 346/107 R |
| 5,045,867 | * | 9/1991 | Fuse | 346/107 R |
| 5,082,165 | * | 1/1992 | Ishizuka | 228/179 |

(List continued on next page.)

FOREIGN PATENT DOCUMENTS

| | | | | |
|---|---|---|---|---|
| 60-154535 | * | 8/1985 | (JP) | 228/4.5 |
| 60-189944 | * | 9/1985 | (JP) | 228/4.5 |
| 5-74841 | * | 3/1993 | (JP) | 228/4.5 |
| 360150638A | * | 8/1985 | (JP) | H01L/21/60 |
| 05074840A | * | 3/1993 | (JP) | H01L/21/60 |
| 07283262A | * | 10/1995 | (JP) | H01L/21/60 |
| 05013517 A | * | 1/1993 | (JP) | H01L/21/607 |
| 06053291 A | * | 2/1994 | (JP) | H01L/21/607 |

*Primary Examiner*—Tom Dunn
*Assistant Examiner*—Kiley Stoner
(74) *Attorney, Agent, or Firm*—Ormiston & McKinney, PLLC

(57) ABSTRACT

An extended travel wire bonding machine that includes a first positioning table movable along an X axis in a first horizontal plane, a second positioning table movable along X and Y axes in a second horizontal plane, the second positioning table being supported on the first positioning table, and a bond head supported on the second positioning table. The wire bonding machine may also include a bonding tool attached to the bond head and a carrier for supporting the leadframe strip under the bonding tool. The first positioning table is moveable for substantially the entire length of the leadframe strip to allow the bonding tool to be successively moved over each semiconductor die on the leadframe strip.

2 Claims, 2 Drawing Sheets

U.S. PATENT DOCUMENTS

| | | | |
|---|---|---|---|
| 5,144,747 | * | 9/1992 | Eichelberger .......................... 29/839 |
| 5,269,452 | * | 12/1993 | Sterczyk .............................. 228/49.2 |
| 5,288,008 | * | 2/1994 | Haji et al. ....................... 228/180.22 |
| 5,307,978 | * | 5/1994 | Ricketson et al. ................... 228/4.5 |
| 5,316,201 | * | 5/1994 | Sugiura ................................. 228/4.5 |
| 5,316,204 | * | 5/1994 | Takehashi et al. ................ 228/179.1 |
| 5,340,011 | * | 8/1994 | Sanchez ............................... 228/4.5 |
| 5,437,405 | * | 8/1995 | Asanasavest ...................... 228/180.5 |
| 5,529,236 | * | 6/1996 | Kobayashi .......................... 228/102 |
| 5,578,913 | * | 11/1996 | Yasuda et al. ...................... 318/569 |
| 5,653,375 | * | 8/1997 | Nam ..................................... 228/4.5 |
| 5,660,316 | * | 8/1997 | Magni .................................. 228/1.1 |
| 5,702,049 | * | 12/1997 | Biggs et al. ......................... 228/105 |
| 5,735,449 | * | 4/1998 | Magni ............................... 228/180.5 |
| 5,813,590 | * | 9/1998 | Fogal et al. ......................... 228/4.5 |
| 5,835,622 | * | 11/1998 | Koljonen et al. . |
| 5,931,368 | * | 8/1999 | Hadar et al. ......................... 228/4.5 |
| 6,015,079 | * | 1/2000 | Fogal et al. ......................... 228/4.1 |
| 6,033,173 | * | 3/2000 | Huang et al. ....................... 414/266 |
| 6,196,445 | * | 3/2001 | Fogal et al. . |

* cited by examiner

WIRE BONDING MACHINE

CROSS REFERENCE TO RELATED APPLICATIONS

This is a continuation of application Ser. No. 09/208,279 filed Dec. 8, 1998, now U.S. Pat No. 6,196,445 which is a continuation of application Ser. No. 08/905,183 filed Aug. 4, 1997, now U.S. Pat. No. 6,015,079, which is a divisional of application Ser. No. 08/574,156 filed Dec. 18, 1995, now U.S. Pat. No. 5,813,590.

FIELD OF THE INVENTION

This invention relates generally to semiconductor device manufacturing and, more particularly, to a positioning table for use with a machine, such as a wire bonding machine, that moves a work piece in a horizontal plane.

BACKGROUND OF THE INVENTION

During the final stages of the fabrication of many types of semiconductor devices or "chips", a single semiconductor die is mounted within a sealed package. A series of leads extend out through the package for connection to an external circuit. Electrical contact is made between conductive pads formed on the face of the die and the external leads using very thin metal wires. One end of each of these wires is bonded to a conductive pad on the die and the other end is bonded to a lead. Generally, the initial components in the packaging process are the dies and the leadframe strip. Several individual leadframes are formed in each leadframe strip. Each leadframe supports a semiconductor die for packaging and provides the external leads for the finished chip. Each leadframe strip is moved as a unit through the various stages of the packaging process.

In a conventional packaging process, the dies are attached to mounting paddles on the leadframe strip. Then, during a wire bonding operation, the bond wires are connected to the conductive bond pads on the die and the lead fingers on the leadframe strip. The dies, bond wires and inner lead fingers are encapsulated and a trim and form operation separates the individual packages on the leadframe strip and bends the outer lead fingers into the proper lead configuration. The present invention is directed to the wire bonding operation. Wire bonding machines are well known in the art. Earlier wire bonding machines were manually operated by an operator viewing the die through a microscope and positioning the bonding tool over the bonding site. More recently, automated wire bonding machines include optical systems for sensing the location of the bond pads and lead fingers and automatically positioning the bonding tool over each bonding site. The Kulicke & Soffa Model 1488 Automatic Bonder wire bonding machine is representative of the automated wire bonding machines that are now commonly used in semiconductor manufacturing.

During a conventional wire bonding process, and using a conventional wire bonding machine such as the Kulicke & Soffa Model 1488, a single die attached to a leadframe on the leadframe strip is held between a clamp and a heat block. The heat block heats the die and the leadframe to a temperature of about 150° C. to about 350° C. A bonding tool mechanically presses the bond wire to a bond pad on the die and then to a bonding site on the appropriate lead finger. The bond wire is typically a fine gold or copper wire that is threaded through the bonding tool. The end of the wire is heated by an electrical discharge or hydrogen torch to a molten state to form a ball of molten metal on the end of the wire. The molten ball is pressed by the bonding tool against the bond pad on the heated die to mechanically bond the bond pad and the wire. The bonding tool is then moved over the bonding site on the corresponding lead finger and the wire is pressed against the lead finger to mechanically bond the lead finger and the wire. The bond wire is then tensioned and sheared. This process is repeated for each bond pad on the die.

An important step in the wire bonding operation is the indexing of the leadframe strip. Indexing refers to the process of moving the leadframe strip to position each die one at a time under the bonding tool so that the optical sensors can locate reference points on the die and properly align the bonding tool over the bond pads and bonding sites on the lead fingers. In a conventional wire bonding machine, each leadframe strip is removed from a magazine wherein several strips are stored and inserted into a rail type carrier. Thereafter, the leadframe strip is moved or indexed along the carrier for each successive die wire bonding operation. After all wire bonding operation cycles are completed, the leadframe strip is moved out of the carrier into a second magazine where it may be stored or transported for further processing. During each indexing step, the leadframe strip is engaged by the indexing mechanism and moved along the carrier. The leadframes, which are made of thin metal sheets, are sometimes damaged during these operations. It would be advantageous to index the bonding tool to each die on the leadframe strip rather than indexing the leadframe strip to the bonding tool. This would minimize the number of times each leadframe strip must be handled and thereby reduce the risk of damaging the leadframe strips. In addition, by moving the bonding tool rather than the leadframe strip, the time required to position each die under the bonding tool could be reduced and overall throughput in the packaging process increased.

The horizontal positioning systems used in conventional bonding machines, however, do not provide sufficient range of motion or speed to allow for bonding tool indexing. Conventional bonding tool positioning devices, commonly referred to as an X-Y table, have a limited range of motion, typically only about 2 inches along both the X and Y directions of travel. What is needed is a bonding tool positioning system that provides a faster and greater range of motion than conventional systems, at least in the X direction along the line of travel of the leadframe strips, while still maintaining the precision necessary to accurately align the bonding tool over the bond pads and lead finger bonding sites.

SUMMARY OF THE INVENTION

Accordingly, it is one object of the present invention is to increase the speed and range of motion of the bonding tool positioning system.

It is another object to index the bonding tool to each die on the leadframe strip rather than indexing the leadframe strip to the bonding tool.

It is another object of the invention to minimize the number of times the leadframe strips are handled during wire bonding operations and thereby reduce the risk of damaging the leadframe strips.

It is a further object to increase throughput in the device packaging process.

These and other objects and advantages are achieved by a device for controlling the position of a work piece in a horizontal plane. The positioning device includes a first positioning table movable along an X axis in a first horizontal plane and a second positioning table movable along X and Y axes in a second horizontal plane. The second positioning table is supported on the first positioning table. In one preferred version of the invention, the positioning device is incorporated into a wire bonding machine. The wire bonding machine includes a first positioning table movable along an X axis in a first horizontal plane, a second positioning table movable along X and Y axes in a second horizontal plane, the second positioning table being supported on the first positioning table, and a bond head supported on the second positioning table. The wire bonding machine preferably also includes a bonding tool attached to the bond head and a carrier for supporting the leadframe strip under the bonding tool. The first positioning table is moveable for substantially the entire length of the leadframe strip to allow the bonding tool to be successively moved over each semiconductor die on the leadframe strip.

In another version of the invention, the wire bonding machine includes (1) a bonding mechanism for bonding wires between conductive bond pads on the semiconductor dies and lead fingers on the leadframes of a leadframe strip and (2) an indexing mechanism operatively coupled to the bonding mechanism for indexing the bonding mechanism to the dies on the leadframe strip. In one embodiment of this aspect of the invention, the indexing mechanism comprises a first positioning table moveable along an X axis in a horizontal plane, the X axis being parallel to the longitudinal axis of the leadframe strip, and a means for supporting the bonding mechanism on the first positioning table, wherein the bonding mechanism is indexed to the dies on the leadframe strip by moving the bonding mechanism forward and backward along the longitudinal axis of the leadframe strip to position the bonding mechanism over any one of the dies. The supporting means preferably consists of a second positioning table movable along X and Y axes in a horizontal plane, the bonding mechanism being supported on and moveable by the second positioning table for adjusting the position of the bonding mechanism relative to a semiconductor die or one of its corresponding lead fingers.

DETAILED DESCRIPTION OF THE INVENTION

Figure 1:
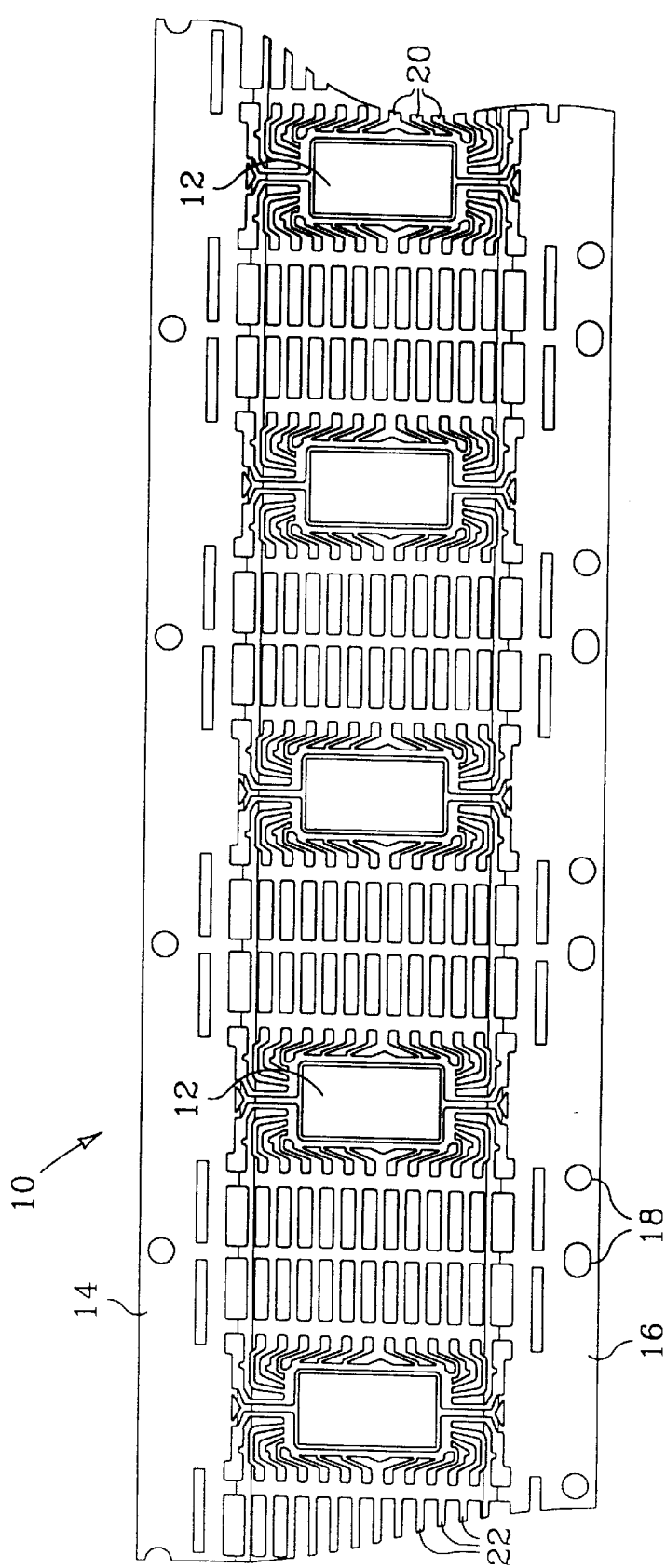
FIG. 1 is a top down plan view of a typical leadframe strip.

A typical leadframe strip 10 used in semiconductor manufacturing is depicted in FIG. 1. The leadframe strip 10 is adapted to mount several semiconductor dies for packaging. Leadframe strip 10 includes die mounting paddles 12 for mounting the individual dies. In addition, the leadframe strip 10 includes parallel spaced strip rails 14, 16 formed with a pattern of openings 18 for handling by automated machinery. The leadframe strip 10 also includes an arrangement of lead fingers 20 adapted for attachment to the bond pads of a die during the wire bonding process. A terminal end 22 of lead fingers 20 will become the external leads of a completed semiconductor package. From the point in the manufacturing process in which the die mounting paddles 12 are coated with adhesive for die bonding, until the point in which the individual semiconductor packages or chips are separated from the leadframe strip rails 14, 16 during a trim and form operation, leadframe strip 10 is treated as a unit in the manufacturing process.

Figure 2:
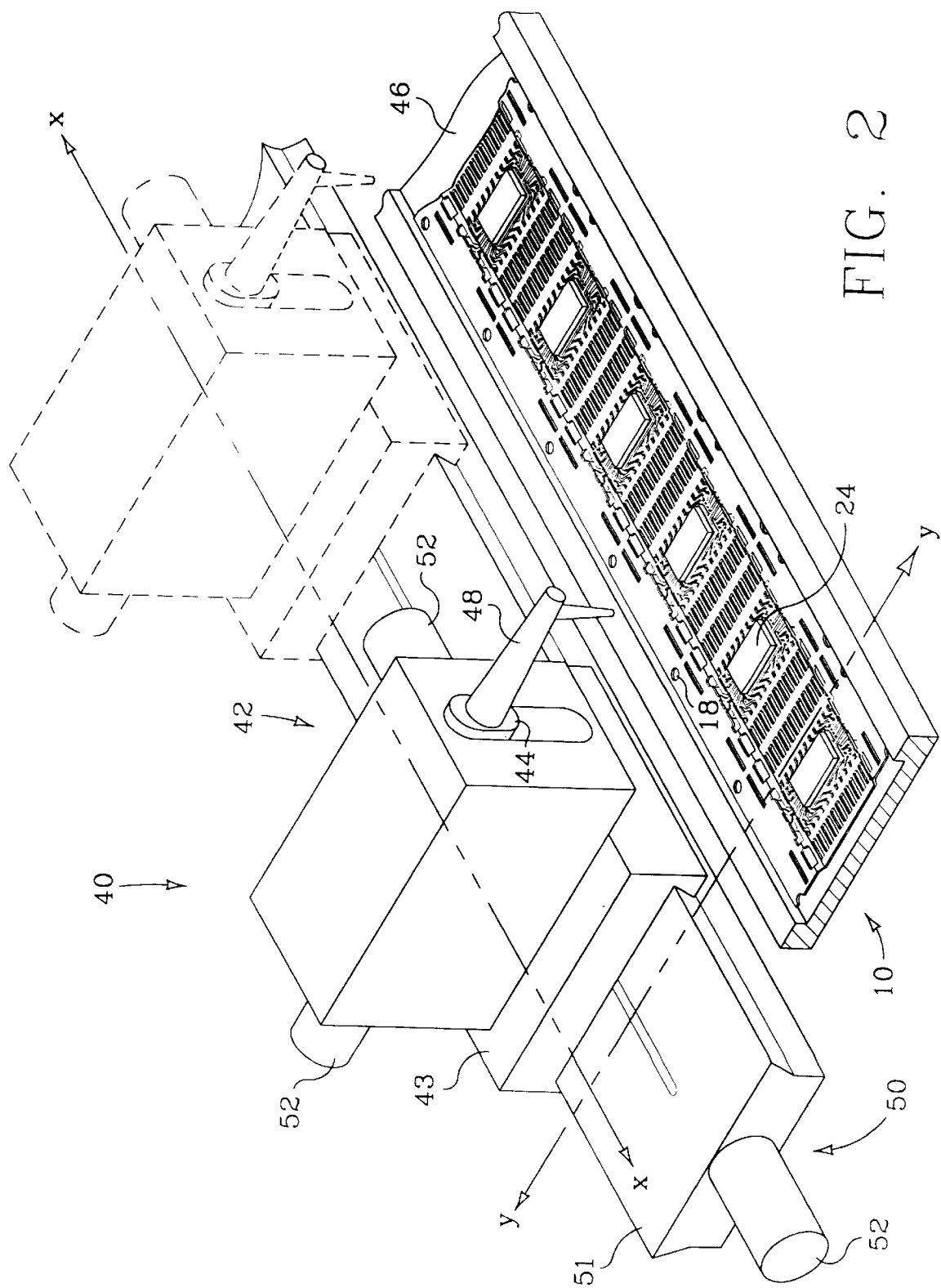
FIG. 2 is a schematic perspective view of the invented extended travel wire bonding machine.

Referring now to FIG. 2, leadframe strip 10 and components of a wire bonding machine 40 are shown schematically during a wire bonding operation. Multiple semiconductor dies 24 have been attached to the die mounting paddles 12 (shown in FIG. 1) of leadframe strip 10 prior to the wire bonding operation. Wire bonding machine 40 represents generally any conventional wire bonding machine of the type having an X-Y positioning table 42 that controls the position of bond head 44 in a horizontal plane. As is known to those skilled in the art of semiconductor packaging operations, the term "table" as used herein refers to the mechanism or system that moves bond head 44 in a horizontal plane. This table mechanism or system includes, for example, servo motor driven lead or ball screws that push or pull the bond head over a bearing surface, such as surface 43 in FIG. 2. The Kulicke & Soffa Model 1488 wire bonding machine is representative of the automated wire bonding machines that are now commonly used in semiconductor manufacturing. In accordance with the present invention, such a wire bonding machine can be modified to extend the travel of the bond head along the X axis and thereby "index" the bond head to each die on the leadframe strip, rather than indexing the leadframe strip as with conventional machines.

Indexing as used herein refers to the process of positioning each die one at a time under bonding tool 48 so that optical sensors in bond head 44 can locate reference points on the die and properly align the bonding tool 48 over the bond pads and bonding sites on the lead fingers. Conventional wire bonding machines include an indexing assembly that moves leadframe strip 10 along carrier 46 to place each die under the bonding tool 48 in bond head 44. Thus, it is said that the leadframe strip 10 is indexed to properly position each die under bonding tool 48. The wire bonding machine of the present invention, by contrast, "indexes" the bond head 44 rather than the leadframe strip 10. That is, bond head 44 is successively moved into position over each die on leadframe strip 10 after wire bonding for each die is completed.

Referring again to FIG. 2, bonding tool 48 is mounted on bond head 44. Bond head 44 is supported on X-Y positioning table 42. X-Y positioning table 42 precisely controls the movement of bond head 44 in a horizontal plane. The vertical position of bonding tool 48 is controlled by a Z-axis positioning device that is typically constructed within bond head 44. These aspects of the wire bonding machine are conventional and well known in the art. X-Y positioning table 42 is supported on extended X axis positioning table 50. In operation, leadframe strip 10 is placed in carrier 46 with the first die (moving from right to left) positioned generally under bonding tool 48. The initial placement of leadframe strip 10 may be made manually or with an automated leadframe indexing assembly, which is a standard feature on most modern wire bonding machines. Leadframe strip 10 is then heated to about 150° C. to about 350° C. on a heat block (not shown) in a conventional manner well known in the art. The heat block apparatus will typically include die paddle contact areas adapted to exert a vacuum force on the bottom of the die paddles to hold the paddle and the die mounted thereon in contact with the heat block. A camera and monitor or other suitable optical system is provided to precisely position bonding tool 48 over the bonding sites. Most modern wire bonding machines may be programmed to operate with an automatic teaching process for precisely locating the bonding tool 48 by optically sensing the location of the bond pads and lead fingers. A variety of automatic teaching processes are well known in the art and are included in the automated wire bonding machines noted earlier in this description. Such automatic teaching processes may include an image processing system for finding the exact position of the bond pads on each die with respect to the adjacent lead fingers and then causing the X-Y table positioning system to align the bonding tool 48 precisely over each bonding site.

A bond wire having a molten ball formed at its end, as previously described, is pressed by bonding tool 48 against the appropriate first bond pad on the first die to bond the wire to the pad. The bonding tool 48 is then moved by the X-Y positioning table 42 to contact the corresponding lead finger to bond the wire to the lead finger. Thereafter, the wire is sheared and the process is repeated for each bond pad on the first die. The movement of the bond head 44 during this part of the wire bond operation is controlled by X-Y positioning table 42. The X-Y positioning table provides for very small but precise movement of bond head 44 to align bonding tool 48 over each bonding site. The total travel of a typical X-Y positioning table is only about 2 inches along both the X and Y axes. But, such tables will deliver movement to a tolerance of ±0.0001 inches.

Once the bonding of the first semiconductor die is completed, bond head 44 and X-Y positioning table 42 are moved to the right along bearing surface 51 by extended X axis positioning table 50 to position bonding tool 48 generally over the second and successive dies, as illustrated by the dotted lines in FIG. 2. The total travel of extended X axis positioning table 50 is preferably slightly longer than leadframe strip 10, which are typically 6 inches to 12 inches long. Because X-Y positioning table 42 will precisely align the bonding tool 48 to the bond sites once the die is located generally under the bond head 44, extended X axis positioning table 50 need only deliver movement to a tolerance of about ±0.01 inches. Consequently, the range and speed of motion of extended X axis positioning table 50 can be made much greater than the range and speed of motion of X-Y positioning table 42. Thus, the bond head 44 can be effectively indexed to the leadframe strip rather than indexing the leadframe strip to the bond head, as in conventional wire bonding machines. The bonding cycle described above is repeated for the second die, and so forth until all dies have been bonded and the bond head 44 is at the far right end of leadframe strip 10. Then, the leadframe strip 10 is released from the heat block and removed from carrier 46. Another leadframe strip 10 is placed in carrier 46 and the process continues as before, except that bond head 44 now moves from right to left. Alternatively, bond head 44 can be returned to its far left position before loading the next leadframe strip into carrier 46.

The structure and operation of extended X axis positioning table 50 is similar to that of conventional X-Y positioning tables. For example, the X-Y positioning table used in the Kulicke & Soffa Model 1488 automatic wire bonder is a table mechanism that consists of X and Y axis slides that are pushed or pulled along their respective tracks by individual servo motor driven ballscrews, represented symbolically by cylinders 52 in FIG. 2. Preferably, the ballscrew or similar device will have a relatively more coarse thread or the device will operate at higher rotational speeds, or a combination of both, to increase the speed of translation of the bond head 44. Cross roller bearings between gibs and sides of each slide allow for the sliding motion. This type of mechanism is suitable for the extended travel X axis positioning table of the present invention, as are other conventional X-Y table mechanisms.

In order to provide a wire bonding machine suitable for practicing the method of this invention, it may be necessary to modify the conventional heat block (and clamping device, if applicable) to allow all dies on the leadframe strip to be heated without advancing the leadframe strip along the carrier. A suitable heat block and clamping device is described in U.S. Pat. No. 5,322,207 entitled Method And Apparatus For Wire Bonding Semiconductor Dice To A Leadframe, issued Jun. 21, 1994 and subject to common ownership herewith, incorporated herein by reference in its entirety.

There has been shown and described a new wire bonding machine having an extended travel X axis positioning table. Although the invention has been described in terms of the preferred embodiment, other embodiments of the inventive concepts disclosed herein are also possible. For example, the extended travel positioning table may be made to provide movement along both the X and Y axes. Therefore, the above description should not be construed to limit the scope of the invention as set forth in the following claims.

What is claimed is:

1. A wire bonding machine for bonding wires between semiconductor dies mounted on leadframes on a leadframe strip and lead fingers on the leadframes, the wire bonding machine comprising:

bonding means for bonding wires between conductive bond pads on the semiconductor dies and lead fingers on the leadframes;

indexing means operatively coupled to the bonding means for indexing the bonding means to the dies on the leadframe strip, the indexing means comprising a first positioning table movable along an X axis in a horizontal plane, the X axis being parallel to a longitudinal axis of the leadframe strip; and means for supporting the bonding means on the first positioning table wherein the bonding means is indexed to the dies on the leadframe strip by moving the bonding means longitudinally forward and backward along the leadframe strip to position the bonding means over any one of the dies.

2. A wire bonding machine according to claim 1, wherein the supporting means comprises a second positioning table movable along X and Y axes in a horizontal plane, the bonding means being supported on and moveable by the second positioning table for adjusting the position of the bonding means relative to a semiconductor die or one of its corresponding lead fingers.

* * * * *